US008360327B2

(12) United States Patent
Clarke

(10) Patent No.: US 8,360,327 B2
(45) Date of Patent: Jan. 29, 2013

(54) ANIMAL TRANSPONDER TAG

(75) Inventor: Ross Robert Clarke, Devonport (NZ)

(73) Assignee: Ensid Investments Ltd. (NZ)

( * ) Notice: Subject to any disclaimer, the term of this patent is extended or adjusted under 35 U.S.C. 154(b) by 0 days.

(21) Appl. No.: 12/905,935

(22) Filed: Oct. 15, 2010

(65) Prior Publication Data

US 2011/0089246 A1 Apr. 21, 2011

Related U.S. Application Data

(63) Continuation-in-part of application No. 10/504,615, filed as application No. PCT/NZ03/00025 on Feb. 14, 2003, now abandoned.

(30) Foreign Application Priority Data

Feb. 14, 2002 (NZ) ........................................ 517225

(51) Int. Cl.
G06K 19/06 (2006.01)
A61B 19/00 (2006.01)
A01K 29/00 (2006.01)
A01K 61/00 (2006.01)
(52) U.S. Cl. .................. 235/492; 340/572.1; 340/573.1; 128/899; 119/215; 119/174
(58) Field of Classification Search .................. 235/487, 235/492; 340/572.1, 572.5, 572.8, 573.1, 340/573.2, 573.3; 128/899; 343/873; 119/174, 119/655; 367/139; 40/300–302; 215/215, 215/216

See application file for complete search history.

(56) References Cited

U.S. PATENT DOCUMENTS

| 4,065,753 | A | * | 12/1977 | Paul, Jr. | 340/10.42 |
| 4,245,652 | A | * | 1/1981 | Kelly et al. | 600/549 |
| 4,251,506 | A | * | 2/1981 | Laby | 424/438 |
| 5,048,179 | A | | 9/1991 | Shindo et al. | |
| 5,173,150 | A | | 12/1992 | Kanaoka et al. | |
| 5,211,129 | A | * | 5/1993 | Taylor et al. | 119/215 |

(Continued)

FOREIGN PATENT DOCUMENTS

AU 49369/96 3/1996
EP 1168236 1/2002

(Continued)

OTHER PUBLICATIONS

Licari, *Handbook of Polymer Coatings for Electronics—Chemistry, Technology and Applications* ($2^{nd}$ Edition), William Andrew Publishing/Noyes, online version available at: http://knovel.com/web/portal/browse/display?_EXT_KNOVEL_DISPLAY_bookid=381 &VerticalID=), p. 166-173 (1990).

Primary Examiner — Michael G Lee
Assistant Examiner — Suezu Ellis
(74) Attorney, Agent, or Firm — Barnes & Thornburg LLP

(57) ABSTRACT

A tag and a method of manufacturing a tag having an electronic device, which may be a transponder embedded in binding material, the method including applying a pre-coat of binding material to the transponder, at least partially curing the pre-coat of binding material, locating the resulting pre-coated transponder in further binding material and curing the further binding material. The method may further include applying a vacuum to the binding material and binding material, heating the binding materials and vibrating the binding materials. Apparatus for producing tags is also described and claimed. The tag has a construction which facilitates subcutaneous introduction into a target subject, such as an animal, and helps provide retention of the tag in the inserted position in the target subject.

9 Claims, 7 Drawing Sheets

U.S. PATENT DOCUMENTS

| | | | |
|---|---|---|---|
| 5,731,957 A * | 3/1998 | Brennan | 361/728 |
| 5,840,148 A * | 11/1998 | Campbell et al. | 156/275.5 |
| 5,895,235 A | 4/1999 | Droz | |
| 5,963,132 A | 10/1999 | Yoakum | |
| 6,113,724 A | 9/2000 | Ogawa et al. | |
| 6,400,338 B1 * | 6/2002 | Mejia et al. | 343/873 |
| 7,135,978 B2 * | 11/2006 | Gisselberg et al. | 340/572.5 |
| 7,289,839 B2 * | 10/2007 | Dimmer et al. | 600/407 |
| 7,479,108 B2 * | 1/2009 | Rini et al. | 600/300 |
| 2002/0024439 A1 | 2/2002 | Kawai et al. | |
| 2002/0133942 A1 | 9/2002 | Kenison et al. | |
| 2002/0151770 A1 * | 10/2002 | Noll et al. | 600/300 |
| 2004/0220856 A1 * | 11/2004 | Moore | 705/14 |

FOREIGN PATENT DOCUMENTS

| | | |
|---|---|---|
| JP | 06-120050 | 4/1994 |
| JP | 07-042514 U1 | 8/1995 |
| JP | 08-273965 | 10/1996 |
| JP | 09-117230 | 5/1997 |
| JP | 10-255336 | 9/1998 |
| JP | 11-102424 | 4/1999 |
| JP | 11-121473 | 4/1999 |
| JP | 11-505604 | 5/1999 |
| JP | 2000-011121 | 1/2000 |
| JP | 2001-229358 | 8/2001 |
| JP | 2002-007989 | 1/2002 |

\* cited by examiner

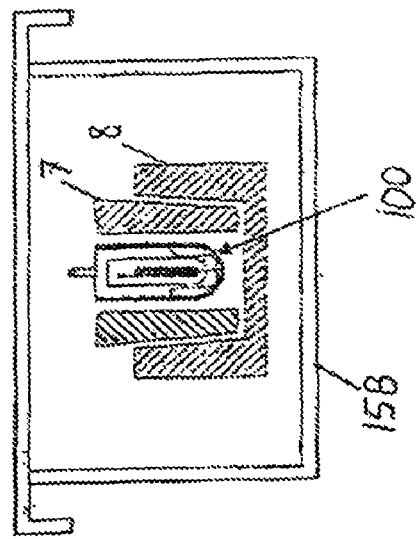
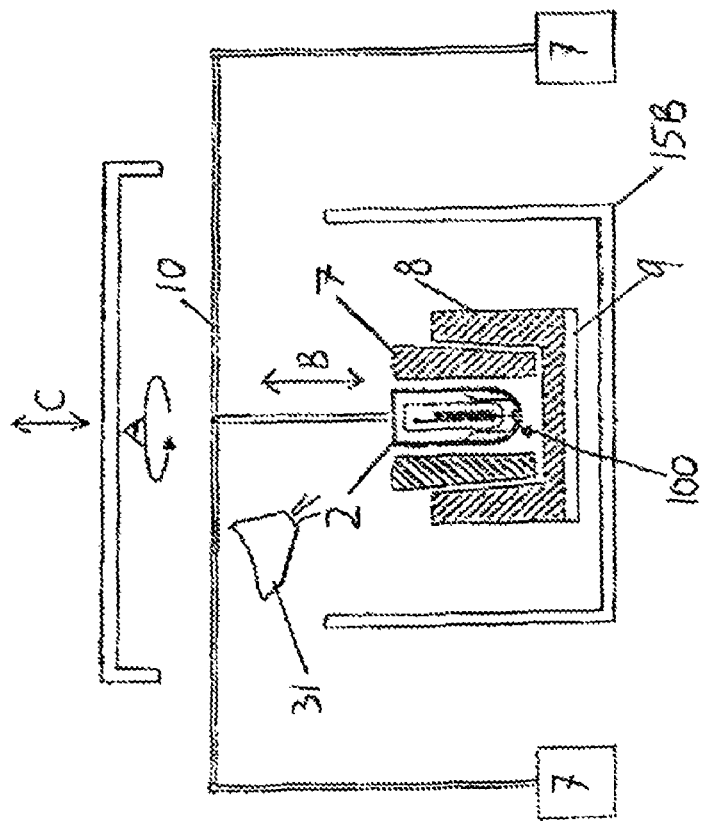
FIG. 5B
FIG. 5A

A

B

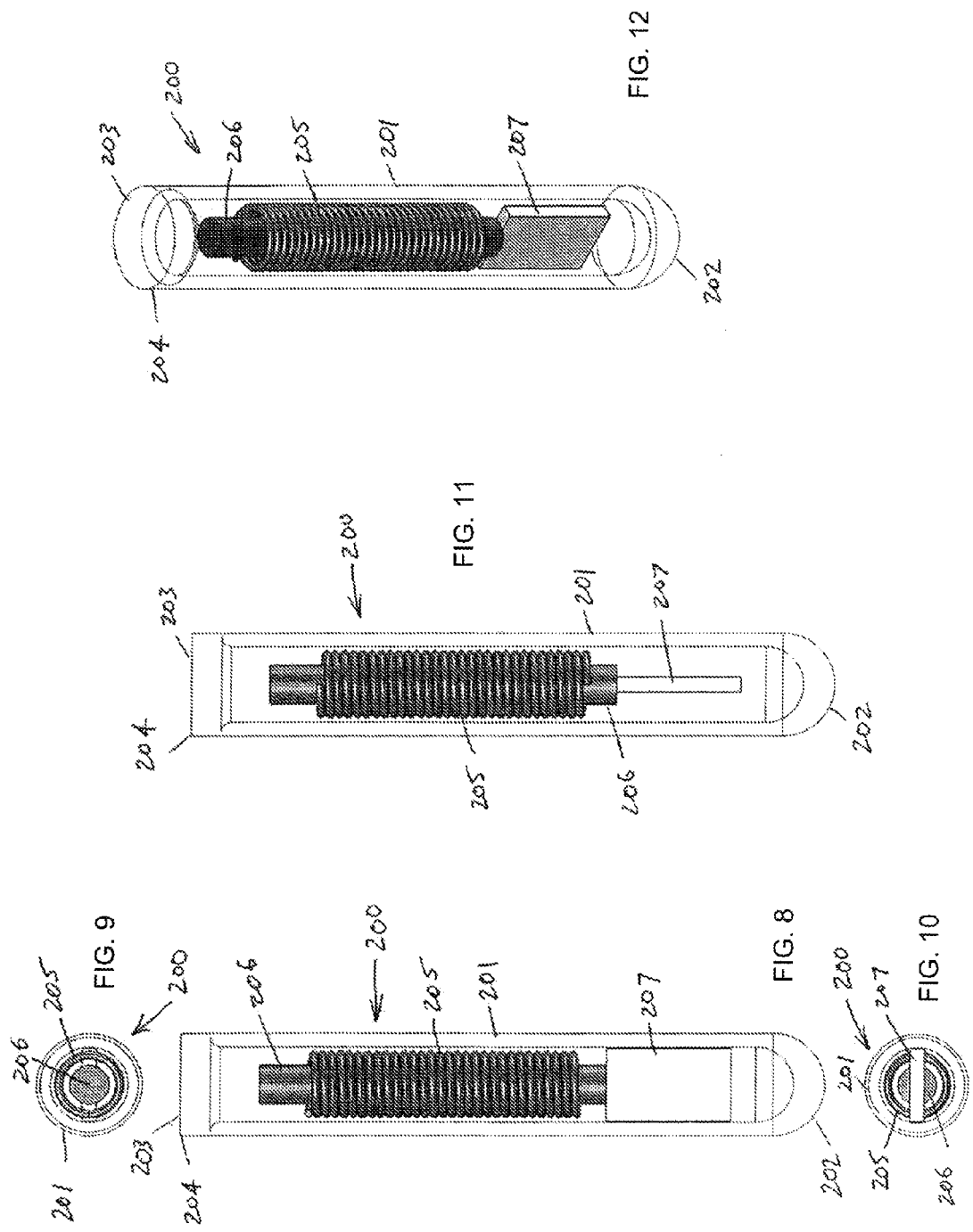

ANIMAL TRANSPONDER TAG

CROSS REFERENCE TO RELATED APPLICATIONS

The present application is a continuation-in-part of co-pending U.S. patent application Ser. No. 10/504,615, filed Mar. 9, 2009, which is a national stage application of International Application No. PCT/NZ03/00025, which claims priority from New Zealand Patent Application No. 517225, filed Feb. 14, 2002. The disclosures set forth in the referenced applications are incorporated herein by reference in their entirety, including all information as originally submitted to the United States Patent and Trademark Office.

TECHNICAL FIELD

The present invention relates to methods and apparatus for the manufacture of a tag and in particular but not exclusively to a tag including a transponder and method and apparatus for the production thereof.

BACKGROUND

For animal tagging using a transponder, a small transponder is often required to minimise the effect on the animal. Traditionally transponders of small dimensions have been provided in a glass case, the glass case protecting the electronics of the transponder from the environment.

After animals have been tagged using a transponder, there is a chance that the animal will be consumed. With a small transponder, the transponder and its casing may also be consumed. Consumption of a glass case can be hazardous, which may prevent the use of small transponders.

In order to obtain the maximum benefit from a tagging programme, transponders should be as robust and reliable as possible.

Means of identification other than transponders may also be used. Transponders have an advantage of relative ease of detection and not requiring their own power source. However, other devices may be required, many of which may be electronic such as a sensor, processor and memory to record information. These may be susceptible to damage in certain environments, even if provided in a casing.

Animals are typically tagged with encased transponders by the encased transponder being implanted in the animal subcutaneously using a tool such as a syringe. The syringe needle through which the encased transponder is introduced into the animal opens an entry path. Over time this closes about the encased transponder. However, for a period of time after the encased transponder is introduced into the animal, the encased transponder is prone to migrating back along the entry path and possibly exiting the animal.

Thus, it is an object of the present invention to provide an encased transponder in the form of a tag and/or method of production thereof that overcomes or alleviates problems in tags and methods of production of tags at present or at least provides the public with a useful alternative.

It is a further or alternate object of the present invention to provide a tag with increased robustness and/or reliability.

Further objects of the invention may become apparent from the following description.

SUMMARY OF THE INVENTION

According to a first aspect of the invention, there is provided a method of manufacturing a tag having an electronic device embedded in binding material, the method including:

a) applying a pre-coat of binding material to an electronic device, wherein the application is performed under vacuum at least part of the time;
b) at least partially curing the pre-coat of binding material;
c) applying further binding material to the resulting pre-coated electronic device; and
d) curing the further binding material about the pre-coated electronic device.

Preferably, the pre-coat of binding material may be the same material as the further binding material.

Preferably, the method may further include subjecting at least one of the pre-coat of binding material and further binding material to a vacuum prior to steps a) and c) respectively.

Preferably, step a) may include subjecting the electronic device and pre-coat of binding material to a vacuum prior to the application of the pre-coat of binding material and maintaining the vacuum during application of the pre-coat of binding material.

Preferably, the method may include subjecting the further binding material to a vacuum after performing step c).

Preferably, the method may further include vibrating at least one of the pre-coat of binding material and further binding material relative to the electronic device while the binding material is subjected to a vacuum.

Preferably, step b) may be of sufficiently short duration so that when the resulting pre-coated electronic device is located in the further binding material, the pre-coat fuses with the further binding material.

Preferably, the method may further include applying heat to the pre-coat of binding material prior to performing step a).

Preferably, the method may further include applying heat to the further binding material prior to performing step c).

Preferably, the method may further include applying heat to the further binding material immediately after performing step c).

Preferably, the binding material may be epoxy resin and the method includes applying heat to the further binding material at a temperature of approximately 60-100 degrees Celsius.

Preferably, step a) may include allowing the electronic device to locate within a volume of said binding material substantially under its own weight.

Alternatively, step a) may include immersing the electronic device within a volume of said binding material at a speed approximate to the speed that the electronic device would sink into the binding material under its own weight.

Preferably, step c) may include allowing the pre-coated electronic device to locate within a volume of said further binding material substantially under its own weight.

Alternatively, step c) may include immersing the pre-coated electronic device within a volume of said binding material at a speed approximate to the speed that the electronic device would sink into the binding material under its own weight.

Preferably, the speed of immersion may be a maximum speed that has been predetermined experimentally.

Preferably, step c) may include locating the pre-coated electronic device and further binding material within a casing that forms an outer shell for the tag and step d) includes allowing the binding material to cure within the casing.

Preferably, the casing includes one or more guides to position the pre-coated electronic device within the casing.

Preferably, the pre-coat of binding material, further binding material and casing may be constructed from materials suitable for consumption.

Preferably, the pre-coat of binding material and further binding material may be epoxy resin and the casing may be acrylic.

Preferably, the electronic device may be a transponder.

Preferably, step d) may include partially curing at a first temperature greater than ambient temperature and then completing curing at a second temperature, less than the first temperature.

Preferably, the second temperature may be ambient temperature.

Preferably, the produced tag may have a length less than approximately 20 mm.

Preferably, the produced tag may have a diameter less than approximately 15 mm.

Preferably, the produced tag may have a diameter less than 10 mm.

According to a second aspect of the invention, there is provided a tag manufactured in accordance with the method described in the immediately preceding paragraphs.

According to a third aspect of the invention, there is provided apparatus for embedding electronic devices within a binding material, the apparatus including:

a receptacle for holding binding material in a liquid state;
a mould or a jig for holding a casing;
filling means for filling said mould or a casing held by said jig with further binding material;
transport means and an associated controller operable to receive one or more electronic devices from a supply of electronic devices, perform a pre-coating operation by moving received electronic devices into said receptacle for holding binding material, and then move said electronic devices into said mould or into a casing held by said jig; and
a vacuum chamber containing said receptacle for holding binding material operable to create a vacuum about the receptacle during at least part of the pre-coating operation.

Preferably, the transport means may be further operable to move said mould or said casing into the vacuum chamber after it has moved said electronic devices into said mould or casing.

Preferably, the transport means may include a closure means for the vacuum chamber that moves with the transport means and the transport means is engageable with the one or more electronic devices or with the mould or casing through an arm that extends into the vacuum chamber from the closure means when the closure means has closed the vacuum chamber.

Preferably, the transport means may include a robotic arm assembly movable about a pivot located outside of the vacuum chamber.

Preferably, the apparatus may include two vacuum chambers located in different sectors about said pivot, each vacuum chamber including a receptacle for holding binding material in a liquid state and the robotic arm assembly includes two of said arms that extend into the vacuum chamber, each movable about said pivot.

Preferably, the apparatus may include two endless conveyors that index a plurality of said moulds or jigs past the transport means.

Preferably, the filling means may be located along said endless conveyors upstream of the transport means.

In another aspect the invention provides an animal transponder tag comprising: a casing, a transponder provider within the casing, a binding material provided within the casing and surrounding the transponder, and wherein the casing is curved at one end and has a substantially planar surface at the other end.

Further aspects of the present invention may become apparent from the following description, which is given by way of example only and with reference to the accompanying drawings.

BRIEF DESCRIPTION OF THE DRAWINGS

FIGS. 5A, B: show diagrammatically the step of applying a vacuum to the casing filled with pre-coated transponders.

FIG. 8: shows a front elevation of another embodiment of a tag according to the invention.

FIG. 9: shows a plan view from above the tag of FIG. 8.

FIG. 10: shows a plan view from below the tag of FIG. 8.

FIG. 11: shows a side elevation of the tag of FIG. 8.

FIG. 12: shows an isometric view from above the tag of FIG. 8.

DETAILED DESCRIPTION OF THE DRAWINGS

The present invention relates to the manufacture of a tag. The invention may have particular application to the manufacture of tags including a transponder as an identification device, although other electronic devices may be used including other electronic identifiers, microprocessors, sensing and recording circuitry, transmitters and receivers and any associated components or other components that may be used in the identification, tracking, recording of the movements and/or recording of the environment of animals. The present invention may have particular application to electronic devices that are susceptible to damage and may also have particular application to the manufacture of small tags having a length of less than approximately 20 mm and a diameter less than approximately 15 mm. More particularly, the produced tags may have a diameter less than 10 mm.

The applicant has found through experimentation that the presence of air bubbles within a tag may contribute to the failure of transponder tags. An increased failure rate may be present when the tag is exposed to an environment having a varying pressure. Such an environment may result, for example, when the tag is used to identify fish. Air bubbles may also contribute to the failure of other electronic devices embedded in binding material. Therefore, it is desirable to produce tags that have no air or reduced amounts of air trapped within the binding material.

Figure 1:
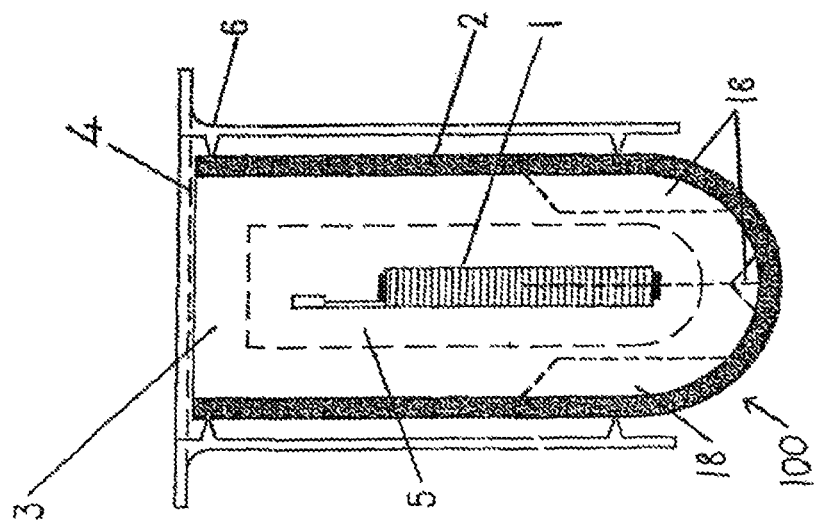
FIG. 1: shows a schematic, cut-away, side view representation of a tag manufactured in accordance with the present invention.

Referring to FIG. 1, a side, schematic, cut-away view of a tag 100 constructed in accordance with the present invention is shown. The tag 100 is held in a receptacle 6 and includes an identification device, in this example a transponder 1, a casing 2, which may be acrylic, and a binding material 3 to hold the transponder 1 in the casing 2. The casing 2 has an opening 4, which in use receives the transponder 1 so that the transponder 1 may be located within an enclosure defined by the casing 2. The tag 100 may be one of a plurality of like tags held in a cartridge of interconnected receptacles 6.

Figure 2:
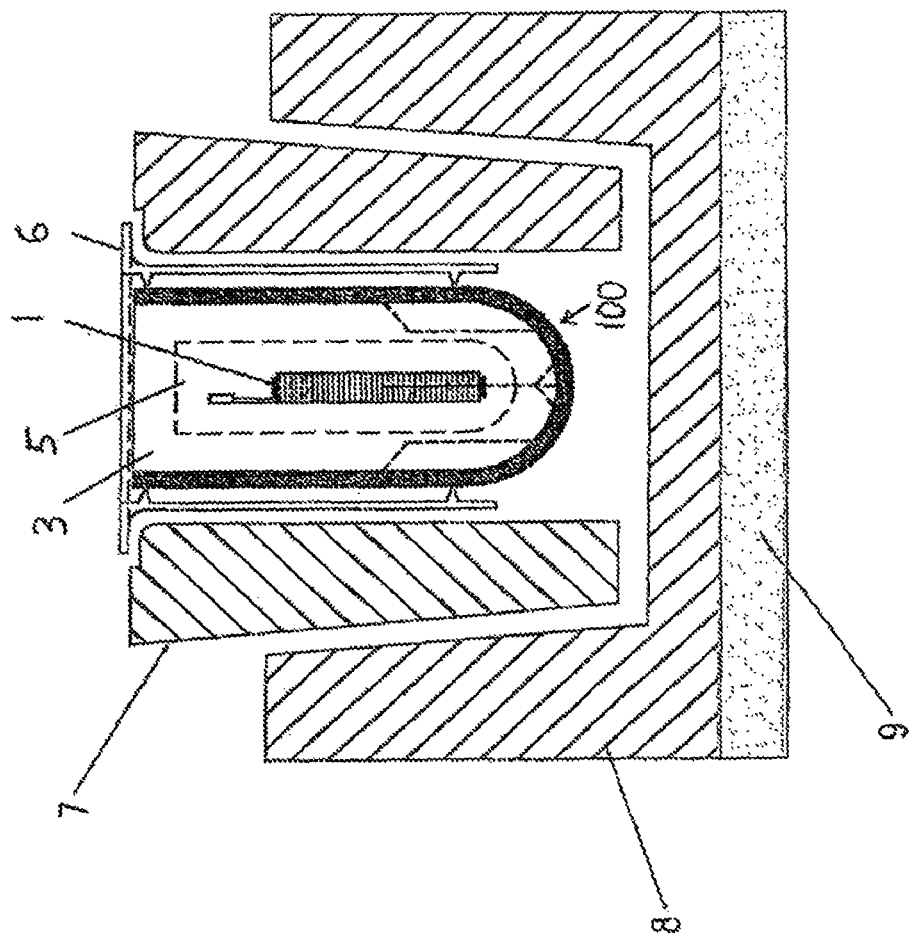
FIG. 2: shows the tag of FIG. 1 located in a jig, which is located on a support.

FIG. 2 shows a jig 7, located on a support 8 and holding the receptacle 6. A vibrator 9 may be provided with the support 8.

The vibrator 9 may be an unbalanced rotating weight, or a suitable electrical vibrator, that when operated vibrates the jig 7 and receptacle 6 in either one or both the horizontal and vertical axes. As is described in more detail herein below, the support 8 and vibrator 9 may be located in a vacuum chamber, allowing a vacuum to be applied to the tag 100 during manufacture.

FIGS. 1 and 2 show the final form of tag, in which the binding material 3 is left to cure. A pre-coat of binding material 5 is provided about the transponder 1 prior to insertion of the transponder 1 into the casing 2. The process to manufacture the tag 100 is detailed below.

Figure 3:
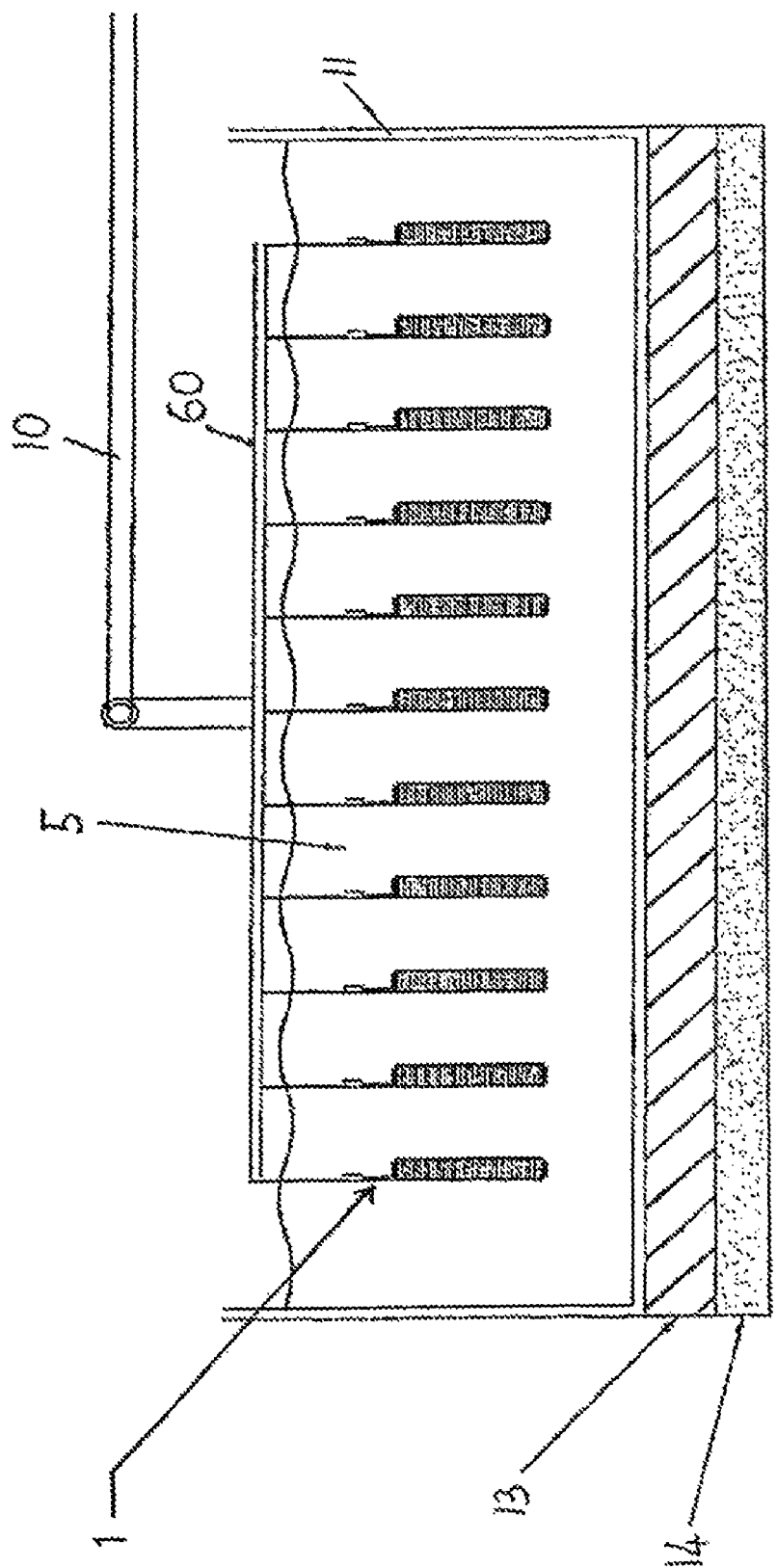
FIG. 3: shows a schematic representation of a robotic arm assembly used to perform the step of applying a pre-coat of binding material to transponders.

Referring to FIG. 3, a schematic representation of apparatus for pre-coating transponders 1 is shown. A plurality of transponders 1 are each attached to a cartridge 60. The cartridge 60 is transported by a robotic arm assembly 10 that is operable to move the cartridge 60 and its attached transponders 1 into a vat 11 containing binding material 5 in liquid state. The liquid binding material 5 may be heated by a heating element 13 and the vat 11 and/or robotic arm assembly 10 may be vibrated by a vibrator 14. The coupling, if any, between the vibrator 14 and robotic arm assembly 10 or cartridge 60 is not shown in FIG. 3.

When the transponders 1 are immersed in the liquid binding material 5, air may become trapped behind their windings. To limit the extent that air is trapped, the transponders 1 may be lowered into the liquid binding material 5 slowly. The rate of immersion may suitably be comparable to the rate that would occur if the transponders 1 were sinking into the liquid binding material 5 under their own weight. An increased rate of immersion may be used depending on the characteristics of the binding material 5, including its viscosity, which will depend on the temperature to which it is heated. A maximum speed of immersion may be found experimentally. The applicant has found through testing that particularly good results can be achieved by manually placing transponders onto a pool of liquid binding material 5 and allowing them to sink and this represents an alternative method of production that may be suited to smaller production volumes.

Figure 4B:
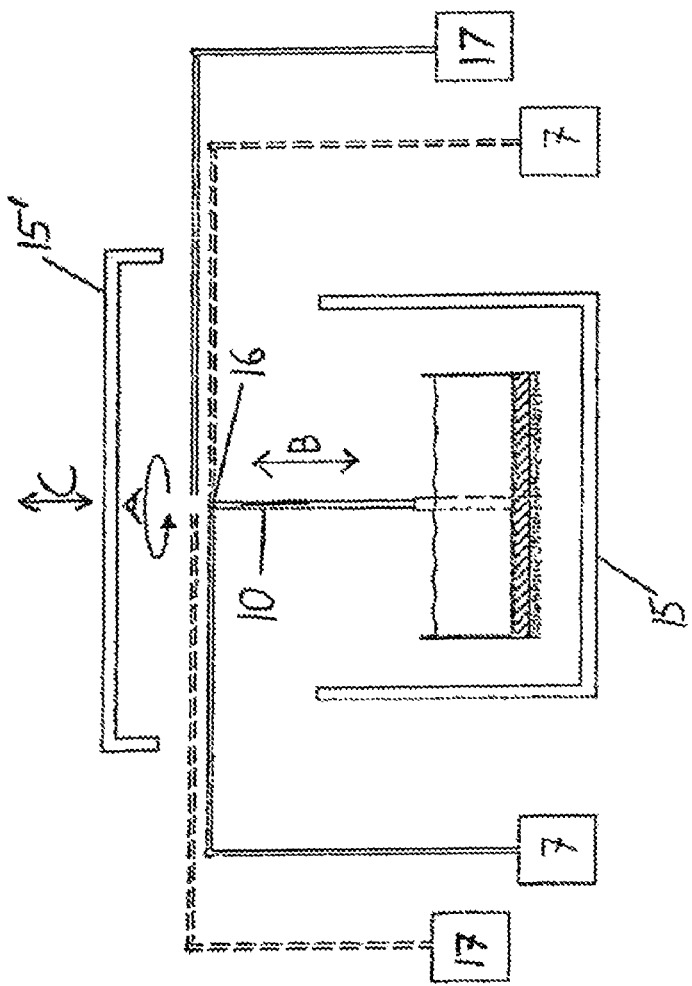
FIGS. 4A, B: show diagrammatically the step of applying a vacuum to the binding material during the pre-coat step.
Figure 4A:
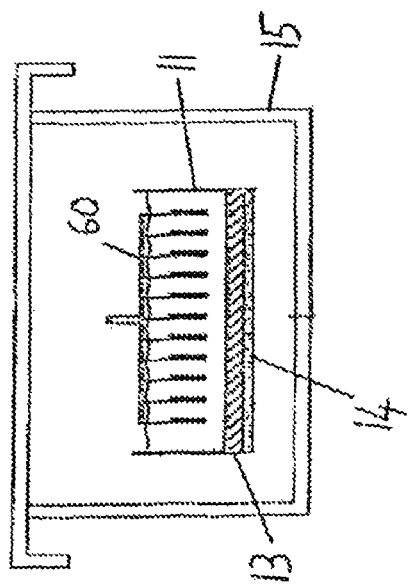

Referring now to FIGS. 4A and 4B, the liquid binding material 5 is located in a vacuum chamber 15. The vacuum chamber 15 creates a vacuum at the surface of the liquid binding material 5, which may assist in the removal of air from behind the windings of the transponders 1. Vibration and/or heat may be applied to the liquid binding material 5 and transponders 1 while they are located in the vacuum chamber 15 through the heating element 13 and vibrator 14 respectively. A vacuum may also be applied to the binding material 5 and transponders 1 prior to the insertion of the transponders 1 to assist in the removal of any air in the binding material 5 and to evacuate air from about the transponders 1.

The liquid binding material 5 may be epoxy resin and may be heated to a temperature between approximately 60 to 100 degrees Celsius. The temperature selected represents a trade-off between decreasing the viscosity of the binding material, thereby allowing easier removal of air and the decreasing the curing time. The viscosity should also be controlled so that the binding material adheres to the transponders 1 and does not simply run off the transponders when they are removed from the vat 11.

As the binding material 5 becomes unusable after it cures to a certain extent, it is replaced periodically. Fresh binding material may be used for every cartridge 60 in order to maximise the temperature that the binding material 5 may be heated to. If multiple pre-coatings are performed the temperature may need to be reduced, which may require an increase the applied vacuum or vibrating the binding material 5 and/or transponders 1 if they were not vibrated before, in order to remove the same amount of air. The level of vacuum applied may be the maximum that avoids excessive volatiles being removed from the binding material 5. The vat 5 may be shaped complimentary to the area occupied by the transponders 1 in order to minimise any waste binding material not applied to the transponders.

The liquid binding material 5, adheres to the transponders 1, which therefore remain covered by a layer of liquid binding material 5 when removed from the vat 11. To form the tag 100, the transponders 1 are removed from the vat 11 and transferred into a casing 2, which has been pre-filled with binding material 3 in liquid state. The insertion of the pre-coated transponders 1 into the casings 2 should be delayed sufficiently so that the pre-coat cures sufficiently so as not to be entirely displaced from the transponder during insertion. However, the binding material 5 may be only partially cured to allow it to fuse at its boundary with the binding material 3 upon insertion, thereby avoiding a fixed boundary between the binding materials 3 and 5. The applicant believes that this avoidance of a fixed boundary may further increase the reliability/robustness of the tag 100. Allowing the pre-coated transponders to sink into the binding material 3 under their own weight or inserting the pre-coated transponders into the binding material 3 slowly, suitably at a similar rate to that which the transponders 1 were immersed into the liquid binding material 3, may reduce the sheer action on the binding material 5, allowing the pre-coated transponders to be inserted earlier without displacing the binding material 3. Using this rate of immersion and epoxy resin heated to approximately 85 degrees Celsius, a curing time of about one minute has been found suitable.

The pre-coated transponders 1 may be severed from the cartridge 60 when partially immersed in the binding material 5, in which case each pre-coated transponder 1 would sink into the binding material 5 under its own weight. Guides 18 (see FIG. 1) may be provided to maintain the pre-coated transponders 1 centrally in their respective casing 2.

The binding materials 3 and 5 may of the same type, although this is not essential, and both may suitably be an epoxy resin. The epoxy resin used may one that is safe for consumption, which may be essential for safety reasons where the tag is to be used in animals. Similarly, the casing 2 may be constructed from a consumable acrylic rather than from glass or other material considered unsafe for consumption.

The vacuum chamber 15 may be elongate and as shown in FIG. 4B, in one embodiment, the robotic arm assembly 10 may be contained inside the vacuum chamber 15 and may have two arms that move about a pivot 16 as indicated by arrow A and movable vertically as indicated by arrow B in order to move cartridges of transponders 1 between the vat 11 and the casings 2 (not shown in FIG. 4) located on jigs 7 positioned alongside the vacuum chamber 15. The robotic arm assembly 10 may receive cartridges 60 from a supply of transponders 17. The lid 15' also moves vertically as indicated by arrow C to allow the robotic arm assembly 10 to extend out of the vacuum chamber 15.

Referring to FIGS. 5A and 5B, a vacuum may also be applied to the casings 2. The vacuum may be applied by a vacuum chamber 15B, which may be the same chamber or a different chamber from vacuum chamber 15. In the instance that it is the same vacuum chamber, the robotic arm assembly 10 may drop the jig 7 into the vacuum chamber 15 on a support 8 located next to the vat 15. The jig 7 and casings 2 may be vibrated by a vibrator 9 during the application of vacuum. Heat may also be applied to the casings 2, for example by using a blower 31 to force hot air of approximately 60 to 100 degrees Celsius (for epoxy resin binding material) over the casings 2. The heating may be performed prior to the application of vacuum pressure outside the vacuum chamber. Alternative methods of heating may be used including, for example, using a heating element that heats the casings 6 through the jig 7.

The robotic arm assembly 10 may alternatively directly carry casings 2 or a cartridge of casings 2 into the vacuum chamber 15 rather than carrying the casings in a jig.

The vacuum and vibration and/or heating may continue until the binding material has cured to an extent that air can not travel through it. This time may vary depending on the resin used and the temperature of the binding material 5 during curing, but for epoxy resin heated to approximately 85 degrees Celsius it may be approximately 20 to 25 minutes. The binding material may then be cured in an oven at approximately 60 degrees Celsius for approximately 30 minutes, then left to cure at ambient for 24 hours prior to distribution or use of the tag 100.

Figure 6:
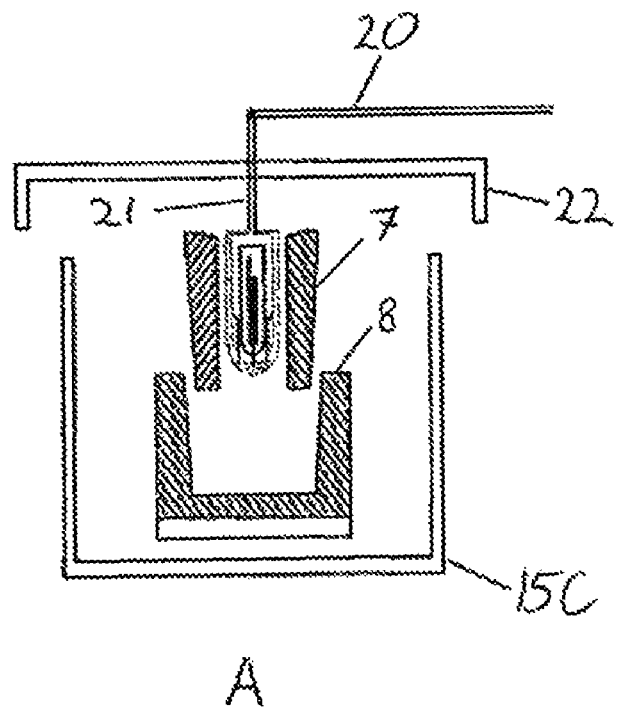
FIGS. 6A, B: shows a schematic representation of an alternative robotic arm assembly that may be used in the manufacture of a tag.
Figure 6:
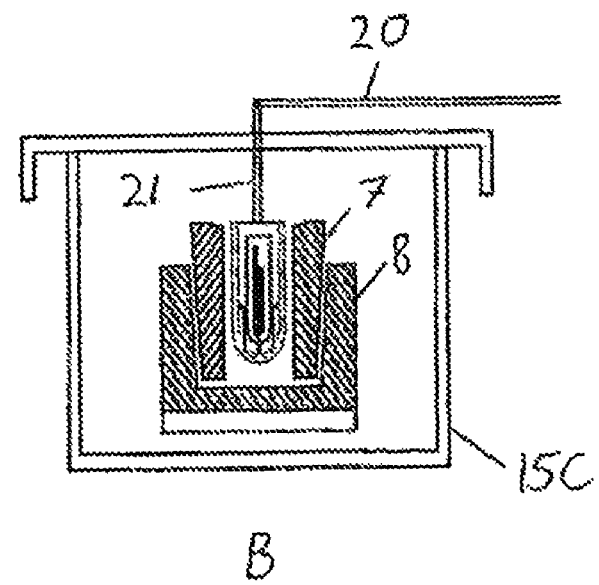

FIGS. 6A, 6B show an alternative robotic arm assembly 20 which is located outside a vacuum chamber 15C. Using this embodiment, smaller vacuum chambers may be used, as they do not need to accommodate the robotic arm assembly 10. An arm 21 of the robotic arm assembly includes a lid 22 or other stop for closing the vacuum chamber 15C (see FIG. 6B). The robotic arm assembly 20 may be used to insert a cartridge of transponders 1 into a vacuum chamber for pre-coating and/or used to transport casings 2 into a vacuum chamber. FIGS. 6A, 6B show the later application. A suitable engagement means (not shown) at the end of the robotic arm assembly 10 is provided below the lid 22 to engage with the cartridges 60 and/or jigs 7. Where a vacuum is required to be formed prior to and/or during insertion of the transponders 1 and/or pre-coated transponders 1, the arm 21 may telescope or otherwise move relative to the lid 22.

Figure 7:
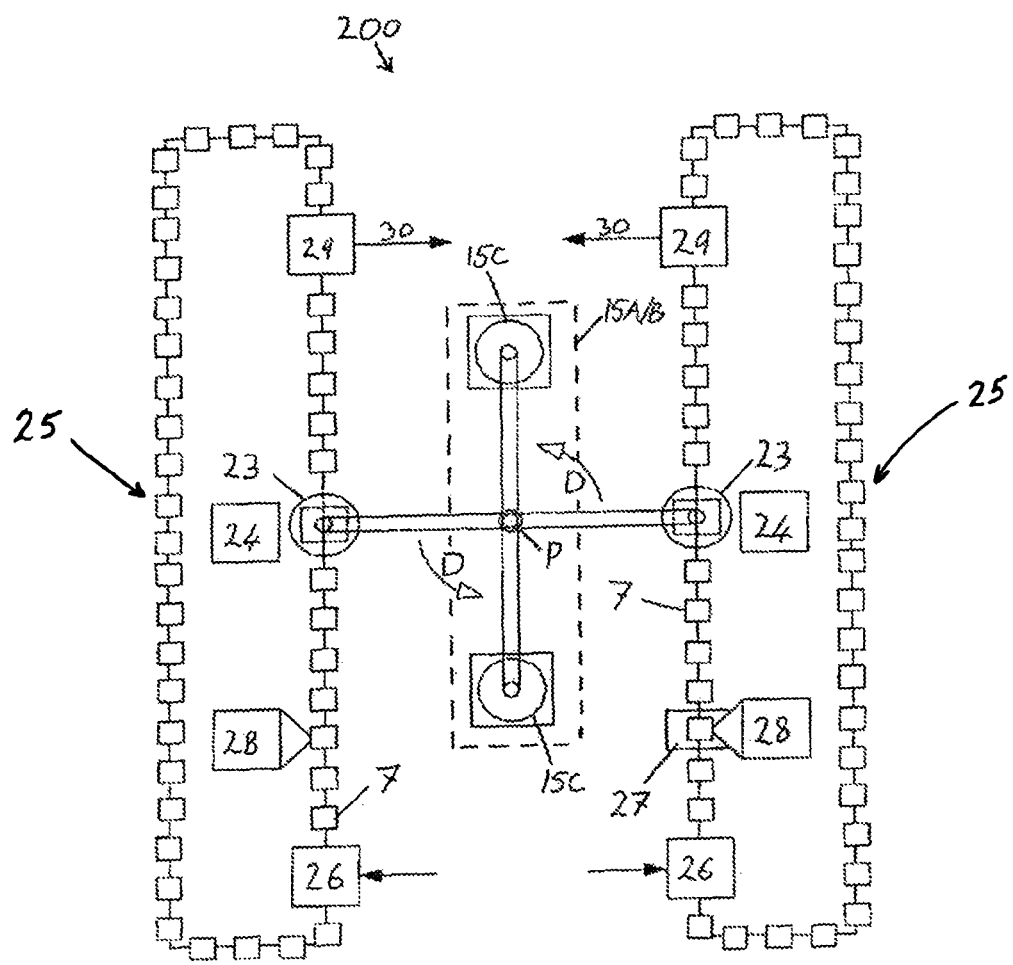
FIG. 7: shows a schematic plan view of a production line for manufacturing tags in accordance with the present invention.

FIG. 7 shows a plan view of a robotic arm assembly 20 as a part of a production line 200. The robotic arm assembly 20 is movable about a pivot P as indicated by arrows D between two load stations 23, where cartridges 60 or jigs 7 holding pre-filled casings 2 are picked up, and two vacuum chambers 15C. The load stations 23 may include a supply of cartridges 24 and be in communication with an indexing conveyor 25 that supplies casings 2 pre-filled with liquid binding material 3 to the load stations 23 and transports the casings 2 away from the load stations 23 after they have received pre-coated transponders 1.

In use, the indexing conveyor 25 indexes round an endless loop, conveying jigs 7 along its path. At station 26 empty casings 2, which may advantageously be in cartridges that separate the casings 2 by the same distance as the separation of transponders 1 in their cartridges, are located onto jigs 7. At station 27, the casings 2 are filled with liquid binding material 3. An air-powered injector 28 may be used for this purpose. The binding material 3 may have been heated, for example by the application of hot air, and located in a vacuum prior to injection into the casings.

Simultaneously to the above, the robotic arm assembly 20 picks up a cartridge of transponders 1 from each supply of transponders 24 at load stations 23 and transports these into a vat (not shown in FIG. 7) of binding material 5 in the vacuum chambers 15C, thereby sealing the vacuum chambers 15C and allowing them to apply a vacuum to the binding material 5. The vacuum chamber 15C may evacuate air from its internal cavity prior to insertion of the cartridges of transponders 1 into the binding material 5 and maintain the vacuum during insertion, removing air from about the transponders 1 even before they are inserted in the binding material. After a predetermined time, dependent on the viscosity of the binding material 5 and the magnitude of the applied vacuum, the cartridge of transponders 1 is removed from the vat 11 and vacuum chamber 15C and inserted into waiting casings 2 filled with binding material 3 at load stations 23.

The robotic arm assembly 20 may then pick up the jigs 7 containing the filled casings 2, and move them into the vacuum chambers 15C, replacing the jigs 7 on the index conveyor 25 after the vacuum has been applied. Heat may be applied during or prior to the application of vacuum and the casings 2 may be vibrated while they are in a vacuum chamber 15C. The index conveyor 25 then moves the filled casings 2 to station 29, where the casings 2 are removed for curing, which may at least initially be performed in an oven 30.

FIG. 7 also shows in outline a vacuum chamber 15A or vacuum chamber 15B if they are different. The index conveyors 25 may still run past the vacuum chamber 15A/15B.

In an alternative embodiment, different vacuum chambers may be used for the pre-coat stage from those used to apply a vacuum to the filled casings. In this embodiment, two robotic arm assemblies 200 may be used, interconnected by the indexing conveyor 25. Also, the binding material 3 may be injected into the casing 6 after the pre-coated transponder 1 has been inserted into the casing, although this represents a less preferred embodiment, as it is anticipated that increased numbers air pockets within the binding material would result.

Furthermore, in another alternative embodiment the pre-coated transponders 1 may be inserted into the casings 6 under vacuum. In this embodiment, the casings 6 are transferred into the vacuum chamber 15C prior to insertion of the pre-coated transponders 1. This transfer may be performed during the curing time of the pre-coated transponders.

Those skilled in the relevant arts will appreciate that the receptacle, jig and vacuum chamber may take many different forms depending at least partly on the required shape and dimensions of the tags to be produced. Also, although the above description has described a robotic arm assembly as the means to move transponders and casings into and out of the vacuum chambers, other transport means, such as a gantry system may be used. Manual transfer of transponders and casings may also be performed.

The tag 100 described herein above has used the casing 2 as a mould for the binding material, the casing forming a permanent part of the tag 100. In an alternative embodiment, the binding material may be cured in a mould that is removable from the binding material after curing.

As can be seen from the foregoing description and drawing Figures, the casing 2 is curved at one end and planar at the other end. The planar end means that there is essentially a 90 degree angle between the outer side wall of the casing and the tag end. This is in contrast with known tag constructions which are typically curved at both ends. The angle defines a retaining edge which is sufficient to prevent the tag from easily exiting an animal body to which it is introduced by a syringe, but is also sufficiently gentle so as not to harm or irritate the animal's flesh.

The tag structure is better seen in the embodiment shown in FIGS. 8 to 12. Referring to those Figures, a tag is shown generally referenced 200 having a casing 201 with a curved end 202 and a substantially planar end 203. The planar end 203 may be simply formed from the binding material being filled to a level position with the upper rim of the mouth of the casing. Alternatively, as can be seen from FIG. 12, the planar end may be formed by a separate plug which is adhered to the mouth of the casing after the binding material and transponder have been introduced. In either arrangement, the planar end 203 defines a retaining edge 204 having the properties described above.

The transponder has an antenna coil 205 about a core 206. An integrated circuit 207 is communicably connected to the antenna coil 205.

Therefore, the invention provides a tag which is contoured to facilitate subcutaneous introduction into an animal by being appropriately curved at one end, and which is also adapted by means of a retaining edge for retention in the animal without harming the animal. Moreover, the use of an acrylic material for the casing, rather than glass, assists in making a connection between the tag and the surrounding animal tissue which further assists with retention of the implanted tag in the animal.

Where in the foregoing description reference has been made to specific components or integers of the invention having known equivalents then such equivalents are herein incorporated as if individually set forth.

Although this invention has been described by way of example and with reference to possible embodiments thereof, it is to be understood that modifications or improvements may be made thereto without departing from the scope of the invention as defined in the appended claims.

The invention claimed is:

1. An animal transponder tag comprising:
    a casing including internal centering guides extending from an index well of the casing:
    a transponder provider within the casing, the transponder being maintained within the casing by the internal centering guide:
    a binding material provided within the casing and surrounding the transponder:
    wherein the casing has a curved end at one end and has a substantially planar surface at the other end; and
    wherein the substantially planar end defines a retaining edge, and the retaining edge assists with retention of the transponder tag when the transponder tag is implanted within the animal.

2. The transponder tag as claimed in claim 1, wherein the casing is constructed from an acrylic.

3. The transponder tag as claimed in claim 1, wherein the binding material comprises an epoxy resin.

4. The transponder tag as claimed in claim 1, wherein the transponder tag comprises an animal identification tag.

5. The transponder tag as claimed in claim 1, wherein the transponder tag comprises a fish identification tag.

6. The transponder tag as claimed in claim 1, wherein the transponder tag is substantially circular in cross section.

7. The transponder tag as claimed in claim 1, wherein the transponder tag has a length of less than 20 mm.

8. The transponder tag as claimed in claim 1, wherein the transponder tag has a diameter less than 10 mm.

9. The transponder tag as claimed in claim 1, wherein the transponder tag is implanted subcutaneously.

* * * * *